(12) United States Patent
Viehmann et al.

(10) Patent No.: US 6,825,707 B2
(45) Date of Patent: Nov. 30, 2004

(54) CURRENT MODE LOGIC (CML) CIRCUIT CONCEPT FOR A VARIABLE DELAY ELEMENT

(75) Inventors: Hans-Heinrich Viehmann, S. Burlington, VT (US); Stefan Lammers, S. Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/384,860

(22) Filed: Mar. 10, 2003

(65) Prior Publication Data

US 2004/0178827 A1 Sep. 16, 2004

(51) Int. Cl.[7] .............................................. H03K 17/62
(52) U.S. Cl. ........................ 327/407; 327/99; 327/408; 327/409; 326/126; 326/127
(58) Field of Search ............................... 326/126, 127; 327/407–409, 411, 99

(56) References Cited

U.S. PATENT DOCUMENTS

| | | | |
|---|---|---|---|
| 5,428,309 A | | 6/1995 | Yamauchi et al. |
| 5,521,540 A | | 5/1996 | Marbot |
| 5,777,505 A | * | 7/1998 | LaRue .......................... 327/407 |
| 6,208,193 B1 | * | 3/2001 | Moyal et al. ................ 327/411 |
| 6,211,721 B1 | * | 4/2001 | Smetana ..................... 327/407 |
| 6,239,646 B1 | * | 5/2001 | Navabi et al. .............. 327/407 |
| 6,462,852 B1 | * | 10/2002 | Paschal et al. .............. 398/202 |

FOREIGN PATENT DOCUMENTS

| | | |
|---|---|---|
| EP | 0 306 662 B1 | 9/1992 |
| EP | 0 562 904 B1 | 9/1996 |
| EP | 0 759 664 A2 | 2/1997 |

* cited by examiner

*Primary Examiner*—Vibol Tan
(74) *Attorney, Agent, or Firm*—Slater & Matsil, L.L.P.

(57) ABSTRACT

An apparatus for a current mode logic variable delay element. A preferred embodiment comprises an input signal that is provided to a multiplexer (for example, multiplexer 210) in both buffered (via a buffer (for example, buffer 205)) and unbuffered form. A control signal of the multiplexer may be used to select from either the buffered or unbuffered input signals. By using a control signal at an intermediate value (somewhere in between values that selects the buffered or unbuffered input signals), the multiplexer may then combine the buffered and unbuffered input signals in proportion with the value of the control signal and imparts a delay upon the input signal that may be in between the delay imparted by the buffer.

22 Claims, 5 Drawing Sheets

CURRENT MODE LOGIC (CML) CIRCUIT CONCEPT FOR A VARIABLE DELAY ELEMENT

TECHNICAL FIELD

The present invention relates generally to logic circuits, and more particularly to an apparatus for a current mode logic circuit with a variable delay.

BACKGROUND

When high-speed and low voltage swing data transfer is needed, differential signaling (also commonly referred to as double ended signals) is perhaps the most robust and promising signaling concept. Current mode logic (CML), a design technique commonly used in high speed signaling applications such as communications chips and routers, uses differential signaling.

CML is widely used in high-speed applications due to its relatively low power consumption and low supply voltage when compared to other types of logic, such as emitter coupled logic (ECL). CML is also considerably faster than CMOS due to its lower voltage swings. CML also has an added advantage of the capability of being fabricated using CMOS fabrication technology.

A common situation that arises in circuit design is timing mismatches between various signals in the circuit, when the signals are needed to occur at essentially the same time. However, due to an unbalanced number of gate delays and/or variations in the fabrication of transistors and logic gates, signals that are to occur simultaneously can often occur with significant amounts of time elapsed between them.

One solution that can be used to fix timing mismatches between various signals in a circuit is to add extra gate delays to the signal path of the signal that is occurring earlier than the other signal. The gate delay can be in the form of circuit elements such as buffer stages, double inverters, and so forth. These circuit elements have differing delays associated with them, depending upon the relative complexity (such as the number of transistors and/or memory elements in the signal path) of the circuit elements. Multiple circuit elements can be cascaded and then selectively enabled/disabled to achieve a proper timing match between the signals.

Another solution that can be used to fix timing mismatches involves the use of latches on the signal paths. The latches then can capture the value on the signal paths, thus synchronizing the signals to a clock that is used to clock the latches. Each latched signal occurs at the same time and in synchrony with the latch clock.

One disadvantage of the prior art is the use of circuit elements to introduce gate delays imparts a fixed amount of delay. Therefore, if the delay that needs to be corrected is a fraction of a minimum gate delay, the delay cannot be corrected.

A second disadvantage of the prior art is that the amount of delay imparted by the circuit elements can themselves change depending on fabrication variances. Therefore, the circuit elements cannot be counted upon to provide a consistent amount of delay across different circuits.

A third disadvantage of the prior art is that the use of latches to synchronize signals does not work well with circuits whose signals are intended to be asynchronous in nature. This means that the signal transitions may arrive at unpredictable times that may be missed by the latches. If signal transitions are missed by the latches, then important information carried on the signals is lost.

SUMMARY OF THE INVENTION

These and other problems are generally solved or circumvented, and technical advantages are generally achieved, by preferred embodiments of the present invention which presents an apparatus for introducing a variable delay in a current mode logic circuit.

In accordance with a preferred embodiment of the present invention, a current mode logic (CML) variable delay element comprising a buffer having an input coupled to an input signal, the buffer to insert a fixed delay to the input signal, a multiplexer having a first input coupled to the input signal and a second input coupled to an output of the buffer, the multiplexer containing circuitry to provide a voltage measured at its inputs to a multiplexer output, and a multiplexer control signal line coupled to a multiplexer control input, the multiplexer control signal line used to carry a multiplexer control signal to proportionally combine the voltage at the multiplexer's inputs and provide it at the multiplexer output.

In accordance with another preferred embodiment of the present invention, a current mode logic (CML) variable delay element comprising a buffer having an input coupled to a input signal, the buffer to insert a fixed delay to the input signal, a multiplexer having first input coupled to the input signal and a second input coupled to an output of the buffer, the multiplexer containing circuitry combine a first voltage on its first input and a second voltage on its second input to produce an output signal that is a delayed version of the input signal, and a multiplexer control signal line coupled to a multiplexer control input, the multiplexer control signal line used to carry a multiplexer control signal to specify a delay imparted upon the input signal.

An advantage of a preferred embodiment of the present invention is that the capability to produce a variable delay enables an arbitrary timing mismatch between signals to be corrected.

A further advantage of a preferred embodiment of the present invention is that multiple variable delay elements can be cascaded to enable a delay period that is greater than possible with a single variable delay element.

Yet another advantage of a preferred embodiment of the present invention is that the delay imparted by the variable delay element is relatively independent of manufacturing differences. Therefore, differences in delay by different variable delay elements that are used on different circuits can be easily compensated for through the ability to vary the delay.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a current mode logic circuit. The invention may also be applied, however, to other circuit types that are in need of a variable delay element.

Figure 1A:
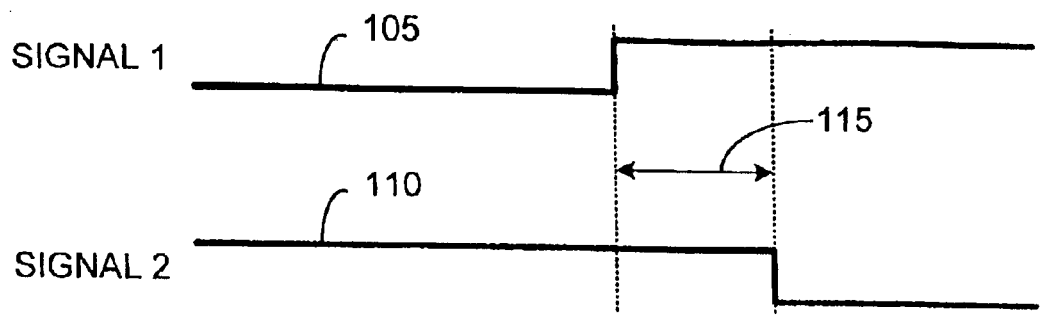
FIGS. 1a and 1b are timing diagrams of a timing mismatch between two signals and the effects of delay compensation on one of the two signals.

With reference now to FIG. 1a, there is shown a diagram illustrating a timing mismatch 115 between a pair of signals 105 and 110. For discussion purposes, let it be the intent that the signals 105 and 110 occur in relative synchrony, when one signal changes value, the other will change values. It need not be that both signals carry the same value, but that they change values at approximately the same time.

However, perhaps due to a different number of gate delays in their respective signal paths (not shown) or certain transistors and/or logic gates not performing as intended, a timing mismatch 115 has occurred between the two signals 105 and 110. So, rather than occurring at approximately the same time, there is a measurable delay after signal 105 changes before signal 110 changes. A timing mismatch that is significant in magnitude may cause the circuit to not perform as expected, perhaps due to incorrectly detected signal line states, improperly synchronized transitions, and so forth. Therefore, timing mismatches should be corrected.

Figure 1B:
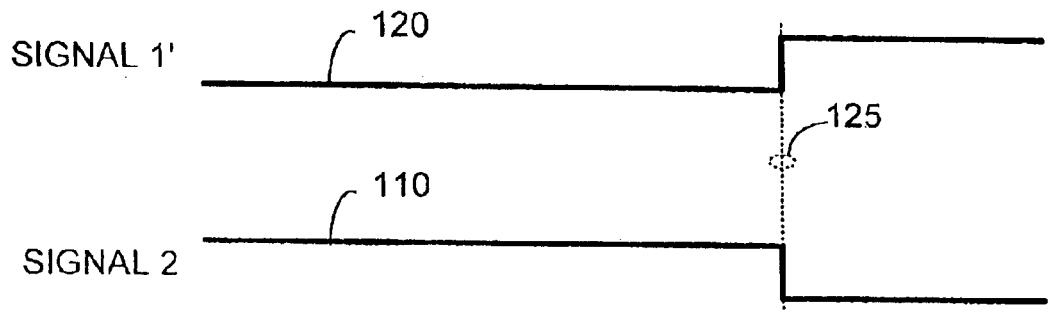

With reference now to FIG. 1b, there is shown a diagram illustrating a pair of signals 110 and 120, wherein signal 120 is a time delayed version of signal 105 (FIG. 1a). By inserting a delay of appropriate duration into the signal path (not shown) for the signal 105, the result may be the signal 120, which has a signal transition that occurs at approximately the same time as the signal 110. Hence, a timing mismatch 125 between the signals 110 and 120 can be negligible or non-existent.

Current mode logic (CML) is a commonly used form of logic for the creation of high-speed circuits. CML offers a significant speed advantage over CMOS (complementary metal-oxide semiconductor) logic due in part to its low voltage swings and constant current flow. Additionally, CML uses differential signaling (also commonly referred to as double ended signals). Differential signaling can add an additional measure of noise immunity due to the fact that the transmitted signal is carried on two conductors and is the difference of the two signals on the two conductors.

CML has an additional advantage over other high-speed forms of logic such as logic using Gallium Arsenide (GaAs) in that CML can be fabricated using the same fabrication lines as the widely used CMOS circuits. This can allow CML circuits to be created on high-technology fabrication lines without requiring a significant out-lay of money to create a special fabrication line. Additionally, CML logic may cohabitate with CMOS logic on the same integrated circuit. Therefore, such hybrid circuits can combine the high-speed aspects of CML logic and the low power requirements of CMOS logic.

Figure 2:
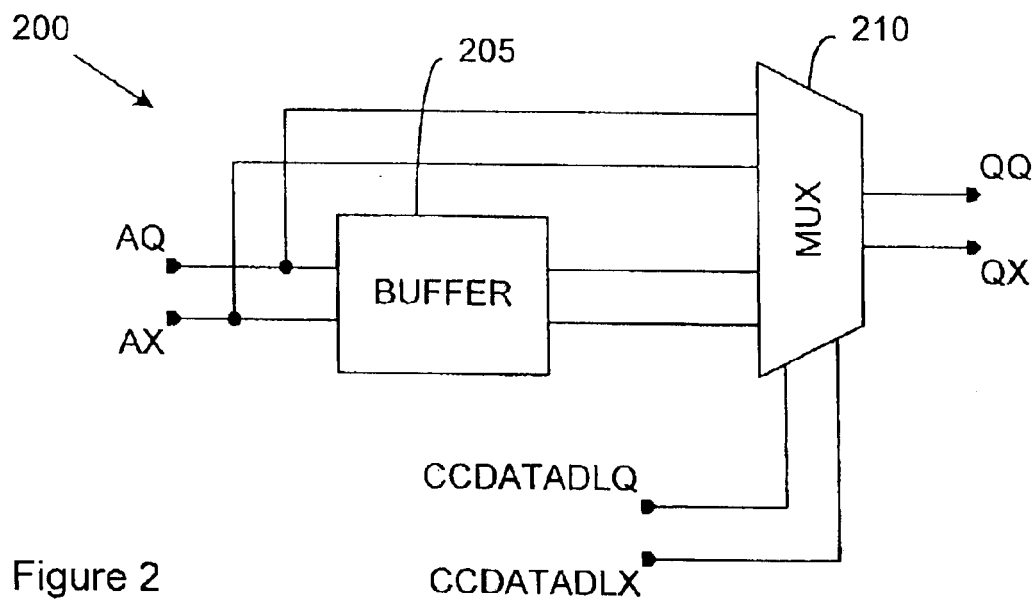
FIG. 2 is a diagram of a high level view of a current mode logic variable delay element, according to a preferred embodiment of the present invention.

With reference now to FIG. 2, there is shown a diagram illustrating a high level view of a CML circuit 200 which can operate as a variable delay element, according to a preferred embodiment of the present invention. The CML circuit 200 can, as illustrated in FIG. 2, impart a variable delay to an input signal "A" (due to differential signaling used in CML circuits, the input signal "A" is provided to the CML circuit 200 as input signals "AQ" and "AX") and provide the delayed signal as an output signal "Q" (again, due to differential signaling, the output signal is provided from the CML circuit 200 as output signals "QQ" and "QX"). Note that in general, a signal will be referenced by its name, such as the input signal "A", but when provided to a CML circuit which uses differential mode signaling, a "Q" and/or "X" will be appended to the signal name, wherein the "Q" and "X" represents the differential mode versions of the input signal "A". For example, the input signal "A", when provided to the CML circuit will be referred to as the input signal "AQ" and the input signal "AX".

The amount of delay imparted onto the input signal "Q" can be controlled by a control signal "CCDATADL" (again, the control signal is provided in the form of two signals "CCDATADLQ" and "CCDATADLX"). According to a preferred embodiment of the present invention, the delay of the CML circuit 200 can be proportional to the magnitude of the control signal "CCDATADL".

The CML circuit 200 includes a buffer 205 and a multiplexer "MUX" 210. The input signal "A" may be split at an input point and provided to the buffer 205 and the multiplexer 210. The buffered version of the input signal "A" is also provided to the multiplexer 210. The control signal "CCDATADL" can then select either the unbuffered input signal or the buffered input signal to provide at the output of the multiplexer 210 as output signal "Q".

Figure 3:
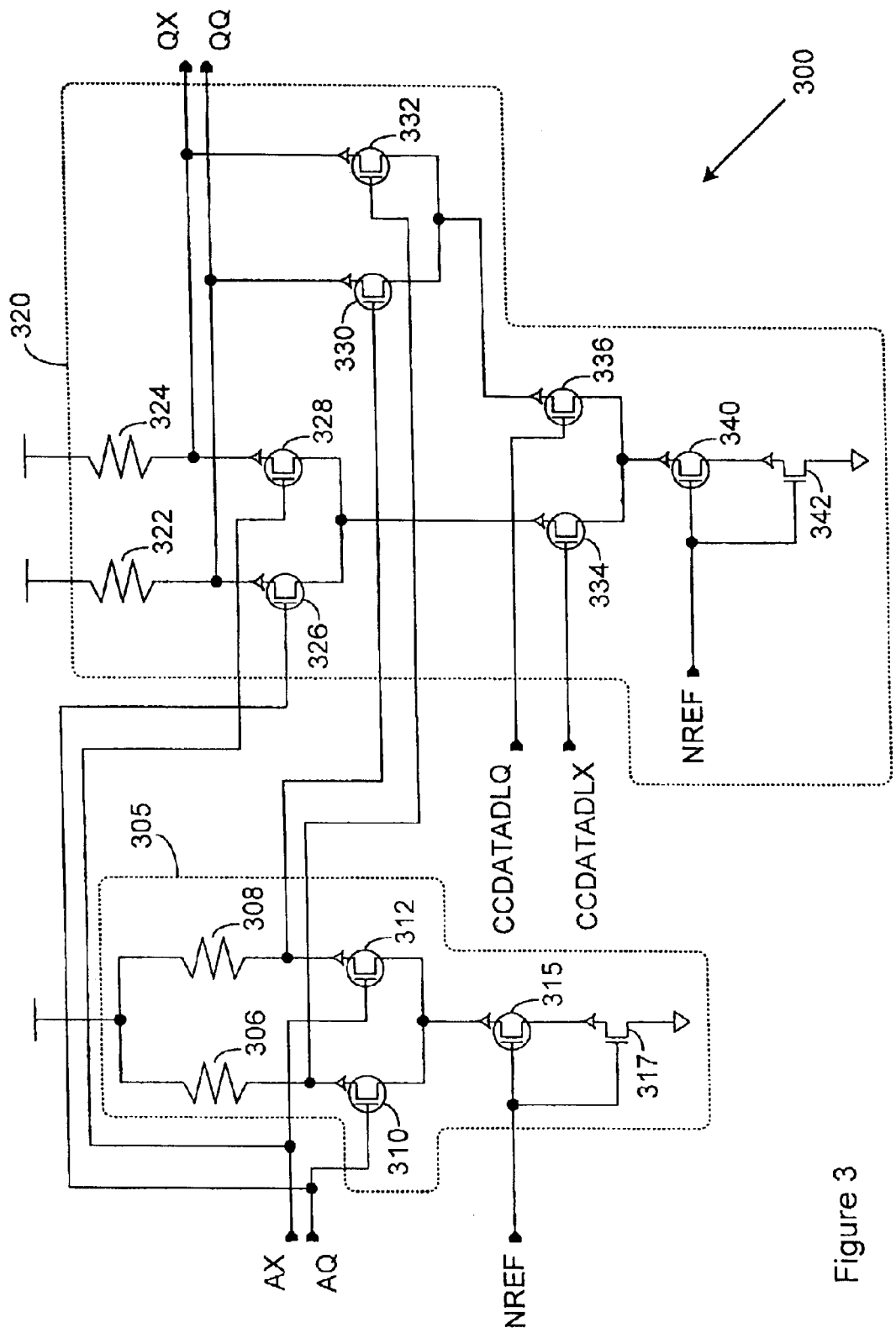
FIG. 3 is a diagram of a schematic view of a current mode logic variable delay element, according to a preferred embodiment of the present invention.

With reference now to FIG. 3, there is shown a schematic diagram of a CML circuit 300 which can operate as a variable delay element, according to a preferred embodiment of the present invention. As displayed in FIG. 3, the CML circuit 300 may be a particular implementation of the CML circuit 200 (FIG. 2). The CML circuit 300 includes a buffer 305 and a multiplexer 320.

The buffer 305 corresponds to the buffer 205 (FIG. 2). Although the buffer 305, as displayed, is a single buffer, multiple buffers may be used. According to a preferred embodiment of the present invention, the buffer 305 may be created out of two resistor/transistor pairs (for example, one resistor/transistor pair is made from resistor 306 and transistor 310) connected in parallel, with one of the two differential signals coupled to the gate of the transistor in one of the resistor/transistor pairs and the other differential signal coupled to the gate of the other transistor in the other resistor/transistor pair. The resistor may be coupled at one end to a voltage source, for example, VDD, and at another other end, the resistor may be coupled to the drain of the transistor. According to a preferred embodiment of the present invention, the transistors used in the CML circuit 300 are N-channel MOSFETs (metal oxide semiconductor field-effect transistors). However, the CML circuit 300 may also be created out of P-channel MOSFETs with small modifications to the illustrated design.

The buffer's output is taken from a node between the resistor and the drain of the transistor in a resistor/transistor pair, with one output taken from one resistor/transistor pair and its complement taken from the other resistor/transistor pair. The sources of the two N-channel MOSFETS may be coupled together and are then coupled to a reference current source that can made from a pair of N-channel MOSFETs 315 and 317, with the transistors 315 and 317 connected in series with their gates coupled to a reference voltage "NREF". The drain of transistor 317 may be coupled to the source of transistor 315. When the reference voltage "NREF" is at a certain level, the transistors 315 and 317 are turned on and a current path can be created (if transistor 310 and/or transistor 312 are also turned on) from the voltage supply to substrate ground. According to a preferred embodiment of the present invention, the transistors 310, 312, and 315 may be low threshold voltage N-channel MOSFET transistors, while transistor 317 may be a normal N-channel MOSFET transistor.

For example, if transistor 310 is on, then a current path exists from the voltage supply, through resistor 306, transistor 310, transistor 315, and transistor 317 to substrate ground. The flow of the current provides the necessary voltage drop across resistor 306 and can result in a voltage drop at the CML buffer's output that is lower than the voltage supply. While transistor 310 is on, transistor 312 is off (this may be due to the differential signal properties of the input signal "A". When transistor 312 is off, a voltage that may be equal to the voltage supply is at the output of the particular resistor/transistor pair (resistor 308 and transistor 312).

The CML multiplexer 320 can be built from more components, with a preferred embodiment of the present invention using seven transistors. As in the CML buffer 305, a pair of transistors 340 and 342, with their gates tied to the voltage reference "NREF," function as a reference current for the CML multiplexer 320. According to a preferred embodiment of the present invention, the transistor 340 and the remainder of the transistors in the CML multiplexer 320 which will be discussed below may have a lower threshold voltage than the transistor 342.

The CML multiplexer 320 may be created from two resistor/transistor/transistor combinations, for example, resistor 322 is coupled serially to a pair of transistors 326 and 330 which are coupled in parallel to each other. The gate of one transistor (for example, transistor 326) may be coupled directly to the input signal "AQ" while the gate of the other transistor (for example, transistor 330) may be coupled to the buffered version of the input signal "AX". The gates of the transistors in the other resistor/transistor/ transistor combination may be coupled to the input signal "AX" and the buffered version of the input signal "AQ". The sources of the two transistors coupled to the unbuffered input signals (transistors 326 and 328) may be coupled together while the sources of the two transistors coupled to the buffered versions of the input signals (transistors 330 and 332) may be coupled together.

As in the CML buffer 305, the transistors in the CML multiplexer 320 are preferably created from N-channel MOSFET transistors. However, the CML multiplexer 320 may also be created from P-channel MOSFET transistors (or other types of transistors) with minor changes to the illustrated design. It is preferred that the design of both the CML buffer 305 and the CML multiplexer 320 be created from the same type of transistor, however. By keeping the transistor usage consistent through out the CML circuit 300, it may keep the overall design simpler.

The CML multiplexer 320 is controlled by a control signal "CCDATADL," which may also be in the form of a differential control signal "CCDATADLQ" and "CCDATADLX." The differential control signals are coupled to the gates of two transistors 334 and 336. The source of the transistor coupled to the differential control signal "CCDATADLX" (transistor 334) is coupled to the sources of the transistors coupled to the unbuffered input signals (transistors 326 and 328) while the source of the transistor coupled to the differential control signal "CCDATADLQ" (transistor 336) is coupled to the sources of the transistors coupled to the buffered versions of the input signals (transistors 330 and 332).

When transistor 334 is turned on by differential control signal "CCDATADLX," a current path exists from resistors 322 and 324 through transistors 326 and 328 and transistors 334, 340, and 342 to substrate ground. Therefore, a voltage drop occurs across resistors 322 and 324 and a voltage with a magnitude that may be less than that of the voltage source may be seen at the outputs of the CML multiplexer. A similar situation exists when transistor 336 is turned on by differential control signal "CCDATADLQ".

Figure 4:
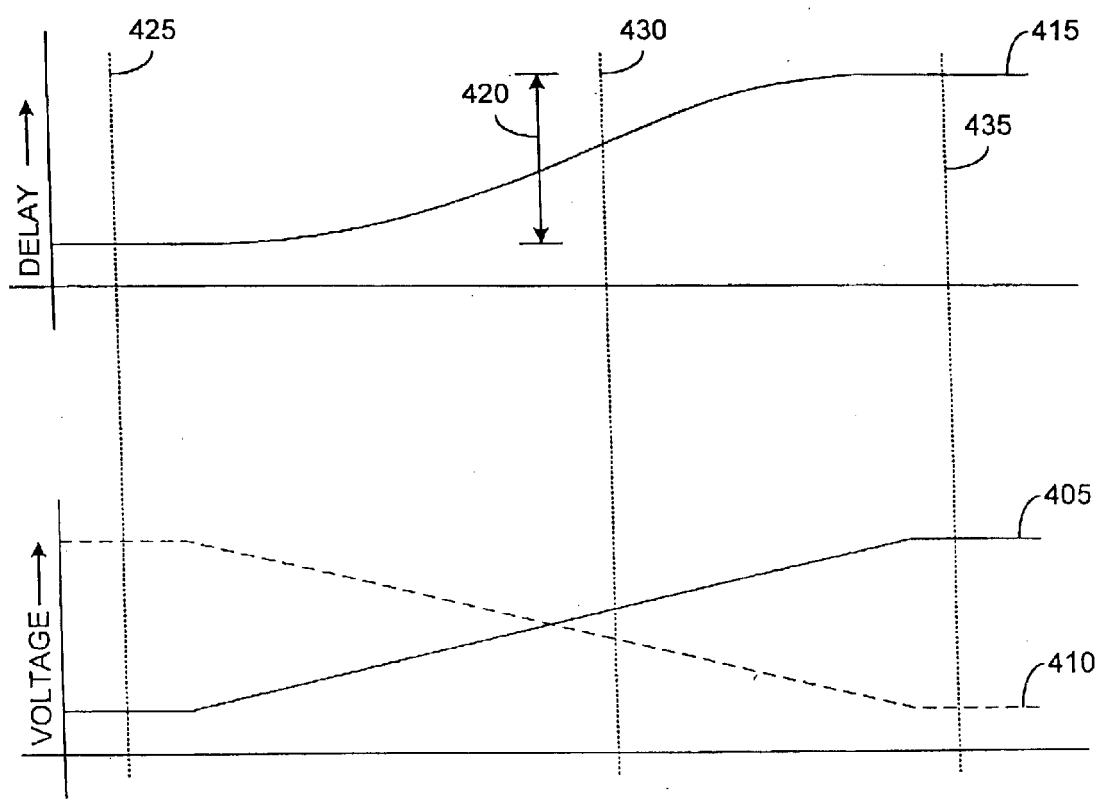
FIG. 4 is a timing diagram illustrating a delay imparted by a current mode logic variable delay element as a function of control signal magnitude, according to a preferred embodiment of the present invention.

With reference now to FIG. 4, there is shown two data plots illustrating signal values on control signals "CCDATADLQ" 405 and "CCDATADLX" 410 and a corresponding delay value (displayed as a curved line 415) imparted on the output of a CML variable delay element (for example, the CML variable delay element 300 (FIG. 3)) as a function of the values of the control signals, according to a preferred embodiment of the present invention. FIG. 4 illustrates that when the control signal "CCDATADLQ" 405 is at a minimum value and "CCDATADLX" 410 is at a maximum value (this situation is highlighted in FIG. 4 with a dotted vertical line 425), the delay on an input signal to the CML variable delay element 300 is at its minimum. Upon closer examination of the CML variable delay element 300, when the control signal "CCDATADLQ" 405 is at its minimum, the transistor 336 is off and the transistor 334 is on (since "CCDATADLX" 410 is at its maximum), there is a current path through resistors 322 and 324 and transistors 326, 328, 334, 340 and 342. Therefore, the output of the CML variable delay element is the input signal "A". The delay imparted in this situation may be the minimum delay that the CML variable delay element can impart on the input signal "A".

A similar situation is displayed when the control signal "CCDATADLQ" 405 is at its maximum and "CCDATADLX" 410 is at its minimum (this situation is highlighted in FIG. 4 with a dotted vertical line 435). When the control signal "CCDATADLQ" 405 is at its maximum, the transistor 336 is on and the transistor 334 is off (since "CCDATADLX" 410 is at its minimum), there is a current path through resistors 322 and 324 and transistors 330, 332, 336, 340 and 342. Therefore, the output of the CML variable delay element is the buffered version of the input signal "A". The delay imparted in this situation may be the maximum delay that the CML variable delay element can impart on the input signal "A". The amount of variable delay is displayed in FIG. 4 as highlight 420.

With reference now back to FIG. 3, if the magnitude of the control signal "CCDATADLQ" (and hence, the magnitude of "CCDATADLX") is allowed to take values that lay in between being maximum and minimum values, it may then be possible for the CML multiplexer 320 to generate a variable delay of the input signal "A". When the control signal "CCDATADLQ" is at a certain value that is not at its maximum, correspondingly, the control signal "CCDATADLX" is at a certain value that is not at its minimum, then the current flowing through transistor 336 may be a fraction of the current that flows when the control signal "CCDATADLQ" is at its maximum value. Correspondingly, the control signal "CCDATADLX" is not at its minimum, there is a current that flows through the transistor 334 that is greater than the minimum current flowing (which may be zero current flow when the control signal "CCDATADLX" is at its minimum) through the transistor 334. Therefore, the output of the CML variable delay element is a combination of the input signal "A" and the buffered version of the input signal "A". In this situation, the delay imparted on the input signal "A" may be proportional to the values of the control signal "CCDATADLQ" and "CCDATADLX" as shown in FIG. 4.

With reference now back to FIG. 4, a situation where the control signal "CCDATADLQ" 405 is not at its maximum value (nor its minimum value) and "CCDATADLX" 410 is not at its minimum value (nor its maximum value) (this situation is highlighted in FIG. 4 with a dotted vertical line 430. With the control signals "CCDATADLQ" 405 and "CCDATADLX" 410 at some intermediate value between their respective maximum and minimum values, the transistors 334 and 336 (FIG. 3) are both partially on. There are two current paths through the CML multiplexer 320 (FIG. 3). A first current path through resistors 322 and 324 and transistors 326, 328, 334, 340, and 342 (all from FIG. 3) and a second current path through resistors 322 and 324 and transistors 330, 332, 336, 340, and 342 (also from FIG. 3).

Note that the total current flow is equal (the current through the resistors 322 and 324 is equal to the currents through the transistors 340 and 342, regardless of the values of the control signal "CCDATADLQ" 405 and "CCDATADLX" 410 however, the current flow through transistors 326, 328, and 334 may be different from the current flow through transistors 330, 332, and 336. It is the difference in these two current flows that proportionally combines the input signal "A" with the buffered version of the input signal "A".

As illustrated in FIG. 4, a CML variable delay element (for example, the CML variable delay element 300 (FIG. 3)) has a minimum and a maximum amount of delay that it can impart upon a signal at its input. In some instances, the maximum amount of delay may not be sufficient and there may be a need for a greater amount of delay. In such situations, it may be possible to cascade multiple CML variable delay elements to form a CML variable delay block so that a larger maximum amount of delay can be achieved.

Figure 5:
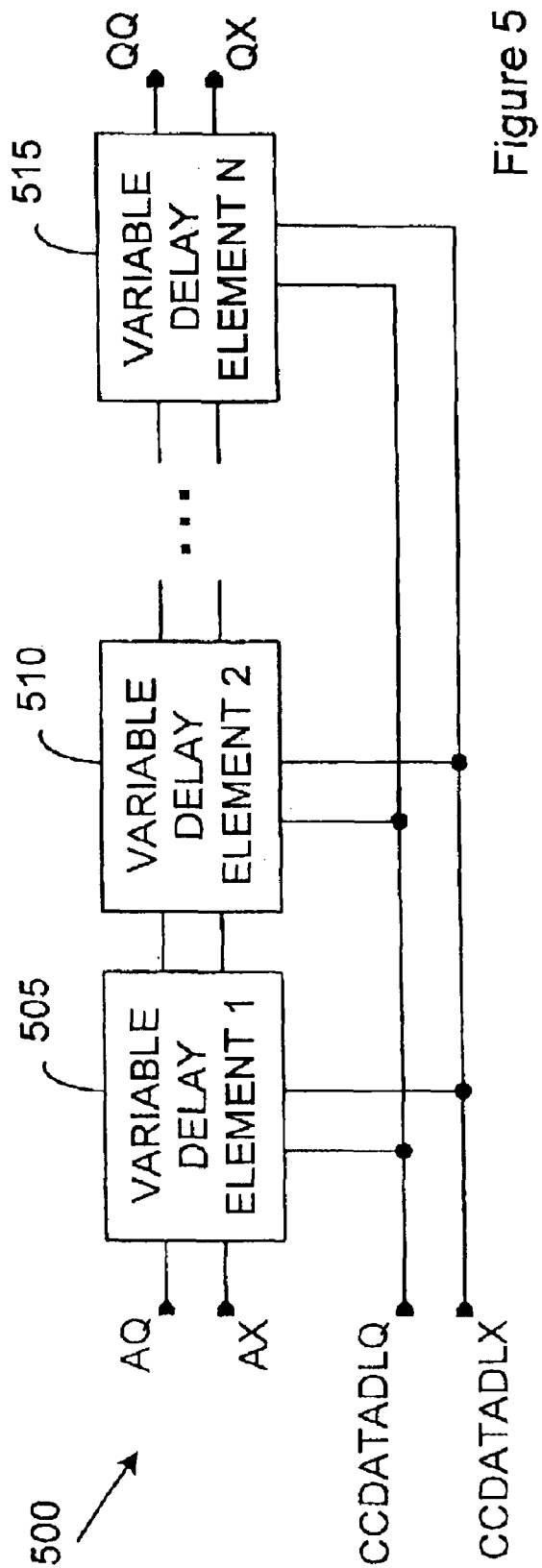
FIG. 5 is a diagram of a current mode logic variable delay block that is made up of a cascade of current mode logic variable delay elements, according to a preferred embodiment of the present invention.

With reference now to FIG. 5, there is shown a diagram illustrating a CML variable delay block 500 that is made up of a cascade of CML variable delay elements, according to a preferred embodiment of the present invention. The CML variable delay block 500 may be made up of N (where N is an integer number greater than one) CML variable delay elements (for example, CML variable delay elements 505, 510, and 515). The N CML variable delay elements can be arranged in a serial fashion with an output of one CML variable delay element (for example, the CML variable delay element 505) becoming an input of another CML variable delay element (for example, the CML variable delay element 510). The input of the CML variable delay block 500 is also the input of a first CML variable delay element in the cascade while the output of the CML variable delay block 500 is the output of a last CML variable delay element in the cascade.

The CML variable delay block 500, with N CML variable delay elements may have a maximum delay of N*max_delay, wherein max_delay is the maximum amount of delay in each CML variable delay element, assuming that each of the N CML variable delay elements are essentially identical. The CML variable delay block 500 may also have a minimum delay of N*min_delay, wherein min_delay is the minimum amount of delay in each CML variable delay element.

According to a preferred embodiment of the present invention, each of the N CML variable delay elements may be controlled by a control signal "CCDATADL" and the same control signal may be provided to each of the N CML variable delay elements. Therefore, with each CML variable delay element being essentially identical, the amount of delay imparted by the CML variable delay block 500 may be equal to N*delay, wherein delay is the amount of delay imparted by each CML variable delay element for a given value of the control signal "CCDATADL".

Figure 6:
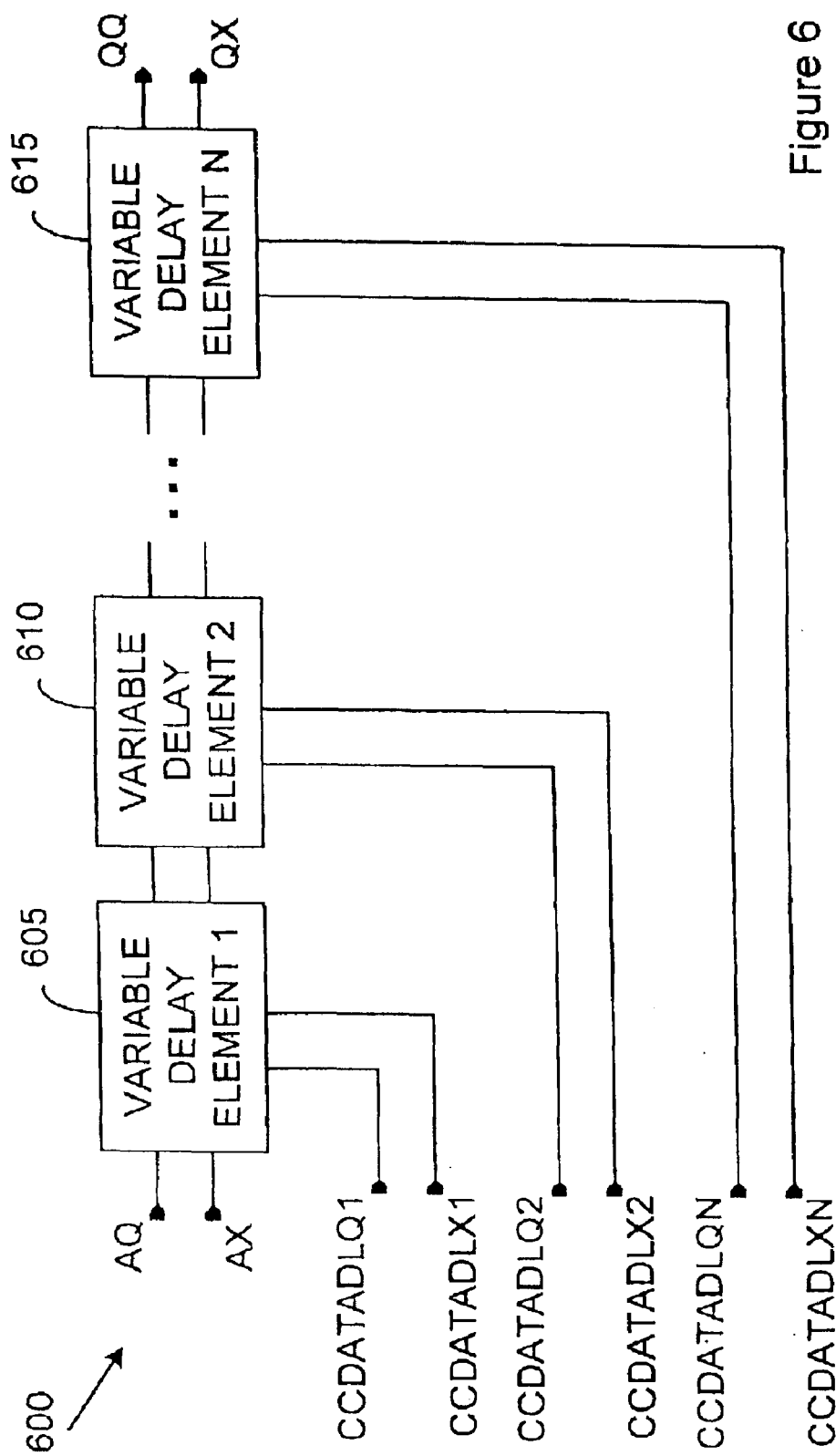
FIG. 6 is a diagram of a second current mode logic variable delay block that is made up of a cascade of current mode variable delay elements, according to a preferred embodiment of the present invention.

With reference now to FIG. 6, there is shown a diagram illustrating a second CML variable delay block 600 that is made up of a cascade of multiple CML variable delay elements, wherein multiple control signals may be used to control the individual CML variable delay elements, according to a preferred embodiment of the present invention. The second CML variable delay block 600 may be made up of N CML variable delay elements arranged in a manner that is similar to the CML variable delay block 500 (FIG. 5). However, instead of having a single control signal to control the amount of delay in all N CML variable delay elements as displayed in FIG. 5, there are a plurality of control signals that may be used to control the amount of delay in the CML variable delay elements.

According to a preferred embodiment of the present invention, each of the N CML variable delay elements may be controlled by its own individual control signal, "CCDATADL1" through "CCDATADLN". By having individual control signals, the granularity of the delay provided by the second CML variable delay block 600 may be finer than the granularity of the delay provided by the CML variable delay block 500. With N CML variable delay elements with delays that are individually controlled, then the amount of delay that may be imparted by the CML variable delay block 600 may be expressed as $$\text{delay} = \sum_{i=1}^{N} \text{delay\_i},$$

where delay_i is the delay imparted by CML variable delay element i.

Alternatively, a single control signal may control more than one CML variable delay element, but not all of the CML variable delay elements. For example, a CML variable delay block may have five CML variable delay elements and two control signals "CCDATADL1" and "CCDATADL2". Then, the control signal "CCDATADL1" may be used to control two CML variable delay elements while the control signal "CCDATADL2" may be used to control the three remaining CML variable delay elements.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A current mode logic (CML) variable delay element comprising:
    a buffer having an input coupled to an input signal, the buffer to insert a fixed delay to the input signal;
    a multiplexer having a first input coupled to the input signal and a second input coupled to an output of the buffer, the multiplexer containing circuitry to provide a voltage measured at its inputs to a multiplexer output; and
    a multiplexer control signal line coupled to a multiplexer control input, the multiplexer control signal line used to carry a multiplexer control signal to proportionally combine the voltage at the multiplexer's inputs and provide it at the multiplexer output.

2. The CML variable delay element of claim 1, wherein the multiplexer comprises:
    a first and a second resistor, each resistor having a first terminal coupled to a voltage supply;
    two pairs of transistors, wherein a first transistor from each pair having a first terminal coupled to a second terminal of the first resistor, a second transistor from each pair having a first terminal coupled to a second terminal of the second resistor, and both transistors within a pair having their second terminals coupled together;
    a fifth transistor having a first terminal coupled to the second terminals of the first pair of transistors and a third terminal coupled to the multiplexer control input; and
    a sixth transistor having a first terminal coupled to the second terminals of the second pair of transistors and a third terminal coupled to the multiplexer control input.

3. The CML variable delay element of claim 2, wherein the multiplexer further comprises a reference current source coupled to a second terminal of the fifth and sixth transistors.

4. The CML variable delay element of claim 3, wherein the reference current source comprises:
    a seventh transistor having a first terminal coupled to the second terminal of the fifth and sixth transistors and a third terminal coupled to a reference voltage level; and
    an eighth transistor having a first terminal coupled to a second terminal of the seventh transistor and a third terminal coupled to the reference voltage level.

5. The CML variable delay element of claim 4, wherein the first through seventh transistors are low threshold voltage transistors.

6. The CML variable delay element of claim 2, wherein the first terminal of a transistor is the drain of the transistor, wherein the second terminal of a transistor is the source of the transistor, and wherein the third terminal of a transistor is the gate of the transistor.

7. The CML variable delay element of claim 1, wherein the buffer comprises:
    a first and a second resistor, each resistor having a first terminal coupled to a voltage supply; and
    a first and a second transistor, the first transistor having a first terminal coupled to a second terminal of the first resistor, the second transistor having a first terminal coupled to a second terminal of the second resistor, the two transistors having second terminals coupled together, and the two transistors having third terminals coupled to the input signal.

8. The CML variable delay element of claim 7, wherein the buffer further comprises a reference current source coupled to the second terminals of the first and second transistors.

9. The CML variable delay element of claim 8, wherein the reference current source comprises:
    a third transistor having a first terminal coupled to the second terminal of the first and second transistors and a third terminal coupled to a reference voltage level; and
    an fourth transistor having a first terminal coupled to a second terminal of the third transistor and a third terminal coupled to the reference voltage level.

10. The CML variable delay element of claim 9, wherein the first through third transistors are low threshold voltage transistors.

11. The CML variable delay element of claim 7, wherein a transistor has three terminals: the first terminal of a transistor is the drain of the transistor, wherein the second terminal of a transistor is the source of the transistor, and wherein a third terminal of a transistor is the gate of the transistor.

12. The CML variable delay element of claim 1, wherein portions of the CML variable delay element is made from N-channel MOSFET (metal oxide semiconductor field-effect transistors).

13. The CML variable delay element of claim 1, wherein the input signal and the multiplexer control signal are differential mode signals.

14. The CML variable delay element of claim 1 comprising a plurality of buffer and multiplexer elements cascaded in serial fashion.

15. The CML variable delay element of claim 14, wherein a single multiplexer control signal line is coupled to the multiplexer control input of each multiplexer.

16. The CML variable delay element of claim 14, wherein each multiplexer has a different multiplexer control signal line coupled to its multiplexer control input.

17. A current mode logic (CML) variable delay element comprising:
    a buffer having an input coupled to a input signal, the buffer to insert a fixed delay to the input signal;
    a multiplexer having first input coupled to the input signal and a second input coupled to an output of the buffer, the multiplexer containing circuitry combine a first voltage on its first input and a second voltage on its second input to produce an output signal that is a delayed version of the input signal; and a multiplexer control signal line coupled to a multiplexer control input, the multiplexer control signal line used to carry a multiplexer control signal to specify a delay imparted upon the input signal.

18. The CML variable delay element of claim 17, wherein the multiplexer control signal regulates current flow, and wherein the current flow determines the first and the second voltages.

19. The CML variable delay element of claim 18, wherein when the multiplexer control signal is small in magnitude, then the first voltage is significantly larger than the second voltage, and the delay imparted upon the input signal is small.

20. The CML variable delay element of claim 18, wherein when the multiplexer control signal is large in magnitude, then the first voltage is significantly smaller than the second voltage, and the delay imparted upon the input signal is large.

21. The CML variable delay element of claim 18, wherein the multiplexer control signal is a differential mode signal with a positive and a negative signal, and wherein the negative signal controls the first voltage and the positive signal controls the second voltage.

22. The CML variable delay element of claim 17, wherein the delay imparted has a minimum value that is about equal to a delay associated with the multiplexer and a maximum value that is about equal to the sum of the delay associated with the multiplexer plus a delay associated with the buffer.

* * * * *